(12) United States Patent
Kohler et al.

(10) Patent No.: US 10,126,184 B2
(45) Date of Patent: Nov. 13, 2018

(54) PIEZOELECTRIC FORCE SENSOR HAVING AN ELECTRICAL CONNECTION BETWEEN ELECTRODE AND CONTACT PIN

(71) Applicant: KISTLER HOLDING AG, Winterthur (CH)

(72) Inventors: Denis Kohler, Neftenbach (CH); Harry Schneider, Henggart (CH); Werner Degen, Zurich (CH)

(73) Assignee: KISTLER HOLDING AG, Winterthur (CH)

( * ) Notice: Subject to any disclaimer, the term of this patent is extended or adjusted under 35 U.S.C. 154(b) by 238 days.

(21) Appl. No.: 15/036,590

(22) PCT Filed: Nov. 13, 2014

(86) PCT No.: PCT/CH2014/000163
§ 371 (c)(1),
(2) Date: May 13, 2016

(87) PCT Pub. No.: WO2015/070357
PCT Pub. Date: May 21, 2015

(65) Prior Publication Data
US 2016/0290879 A1    Oct. 6, 2016

(30) Foreign Application Priority Data

Nov. 14, 2013 (CH) ..................................... 1909/13

(51) Int. Cl.
| | | |
|---|---|---|
| G01L 1/16 | (2006.01) | |
| H01L 41/047 | (2006.01) | |
| H01R 4/48 | (2006.01) | |
| H01R 13/33 | (2006.01) | |
| G01L 1/04 | (2006.01) | |

(52) U.S. Cl.
CPC ................ *G01L 1/16* (2013.01); *G01L 1/042* (2013.01); *H01L 41/0475* (2013.01); *H01R 4/4863* (2013.01); *H01R 13/33* (2013.01)

(58) Field of Classification Search
CPC ....... G01L 1/042; G01L 1/16; H01L 41/0475; H01R 13/33; H01R 4/4863
See application file for complete search history.

(56) References Cited

U.S. PATENT DOCUMENTS 4,139,792 A * 2/1979 Kondo .................... F23Q 3/002
                                                    310/339
5,111,699 A * 5/1992 Walstra ................... G01L 23/10
                                                    73/114.51

(Continued)

FOREIGN PATENT DOCUMENTS

| CN | 1389960 A | 8/2003 |
|---|---|---|
| DE | 4441303 | 1/1996 |

(Continued)

OTHER PUBLICATIONS

International Search Report, dated Jan. 27, 2015.
English translation of Chinese First Office Action, dated Apr. 27, 2017.

*Primary Examiner* — Francis C Gray
(74) *Attorney, Agent, or Firm* — Dority & Manning, P.A.

(57) ABSTRACT

The invention relates to a piezoelectric force sensor (1) comprising a housing (10) having at least one piezoelectric body (11) and an electrode (12) electrically connected to said body (11), wherein a connection device (13) for forwarding measurement signals having a contact pin (131) is fastened or molded on the housing (10). The contact pin (131) is connected to the electrode (12) in an electrically conductive manner. According to the invention, a helical compression spring (14) is electrically conductively connected to the contact pin (131) as an electrical connection within the piezoelectric force sensor (1). For this purpose, the helical compression spring (14) is removably electrically conductively connected to the electrode (12) in an operative manner so that the contact pin (131) has a spatial clearance (Continued)

from the electrode (12) and measurement signals from the electrode (12) can be extracted from the housing (10) of the piezoelectric force sensor (1) via the helical compression spring (14) and the connected contact pin (131) and can be picked up on the connection device (13).

13 Claims, 2 Drawing Sheets

(56) References Cited

U.S. PATENT DOCUMENTS

| | | | |
|---|---|---|---|
| 5,906,520 A | 5/1999 | Frinker et al. | |
| 7,704,107 B1 | 4/2010 | Desmond | |
| 8,408,951 B1 | 4/2013 | Chartrand | |
| 2011/0110542 A1* | 5/2011 | Masuda | B06B 1/0603 |
| | | | 381/190 |
| 2014/0021387 A1* | 1/2014 | Schmieder | F02M 51/005 |
| | | | 251/129.15 |
| 2014/0077793 A1* | 3/2014 | Arai | G01N 27/00 |
| | | | 324/109 |
| 2018/0087993 A1* | 3/2018 | Satoh | G01L 23/10 |

FOREIGN PATENT DOCUMENTS

| | | |
|---|---|---|
| GB | 945130 | 12/1963 |
| GB | 2263202 | 7/1993 |
| WO | WO 2009/06030 | 2/2009 |

* cited by examiner ion Serial No. PCT/CH2014/000163, filed Nov. 11, 2014, which claims priority to Swiss Application No. 1909/13, filed Nov. 14, 2013. International Application Serial No. PCT/CH2014/000163 is hereby incorporated herein in its entirety for all purposes by this reference.

FIELD OF THE INVENTION

The present invention describes a piezoelectric force sensor comprising a housing having at least one piezoelectric body and an electrode electrically connected to said body, wherein a connection device for forwarding measurement signals having a contact pin is fastened or molded on the housing and wherein the contact pin is connected to the electrode in an electrically conductive manner.

BACKGROUND

In several technical fields, force sensors and particularly piezoelectric force sensors are employed which comprise at least one piezoelectric body. Such piezoelectric force sensors are commercially available in different designs for a component for measuring forces in one spatial orientation (Fz) up to six components for the measurement of forces and moments (Fx, Fy, Fz, Mx, My, Mz). The fields of application are force measurements in assembly technique, for example in spot welding and in pressing, in the measurement of cutting and forming forces as well as in the field of determining the braking forces in rail vehicles.

Known piezoelectric force sensors that can be employed for the determination of torque or of accelerating forces in addition to force measurement are referred to as piezo load washers. Such a piezo load washer 1 known from the prior art for the measurement of dynamic and quasi-static forces Fz in one spatial direction (z direction) is shown in FIGS. 1a and 1b and will be explained in more detail hereafter. Piezo load washer 1 comprises a multi-part housing 10 on which a connection device 13 is fastened or molded. Typically, the housing 10 is made of steel and has a lid and a bottom. Within the housing 10 is provided a central opening 100 (FIG. 1a) through which a preloading screw (not shown) can be passed. Here, as shown in FIG. 1a, two piezoelectric bodies 11, 11' having an annular shape surrounding a central axis extending in the z direction are arranged in the housing 10 stacked one on top of the other. Between the piezoelectric bodies 11, 11' each of which has the shape of an annular body is an electrode 12. The electrode 12 has an electrode body 120 in the shape of an annular body surrounding the central axis extending in the z direction and to which an electrode tab 121 is molded or welded leading away in radial direction from the central z axis. A joining plate 122 curved in the direction of the z axis is welded to the electrode tab 121.

In the circumferential wall of the housing a connection opening 101 is formed leading into a feedthrough 130 of the connection device 13 as shown in FIG. 1a. The electrode tab 121 and the joining plate 122 extend through the connection opening 101 into the interior of the feedthrough 130 up to a contact pin 131 of the connection device 13. Contact pin 131 is electrically insulated from the walls of the feedthrough 130 by means of the insulation 132 and the housing 10 assembled attached thereto. Contact pin 131 is connected to the electrode tab 121 via joining plate 122 in an electrically conductive and form-fit manner.

For the external cable connection of piezo load washer 1 to measurement electronics, connecting cables in the form of highly insulating low capacity coaxial cables are used. These connecting cables generate only minimal frictional electricity upon minimal movement. Such connecting cables for industrial use are commercially available and can be easily connected to the connection device 13 of the piezo load washer 1 so that charge signals can be picked up from the contact pin 131. For the piezo load washer 1 to be able to measure forces the components must be arranged in the housing 10 in z direction in a way that they are pressed onto each other and, thus, the components must be welded immovably fixed inside the housing.

To carry out measurements, the piezo load washer 1 is mounted by means of a preloading screw between two coplanar surfaces of a machine structure under a preload. In case of a load in z direction, piezo load washer 1 emits electrical charges proportional to the applied force Fz. Due to a force acting on the piezoelectric body when a load is applied and by utilizing the piezoelectric effect, charge signals will be generated that are led via electrode 12 across the feedthrough 130 to the contact pin 131 where the charge signals can be picked up and processed from the exterior of the piezoelectric force sensor 1.

Previously, point welding by means of resistance or laser welding has been carried out to achieve an electrical connection of the electrode 12 via electrode tab 121 and joining plate 122 on the contact pin 131. As shown in FIG. 1c, a first piezoelectric body 11' and the electrode 12 are positioned in the bottom of the opened housing 10 wherein feedthrough 130 has already been fastened to a circumferential surface of the housing. Electrode tab 121 together with the joining plate 122 fastened thereto are arranged such that they extend out of the housing 10 via the feedthrough 130 and such that the joining plate 122 is positioned in front of a front face of the contact pin 131. Then, a welding electrode S can be inserted through connection opening 101 so that the joining plate 122 can be point welded to the front face of the contact pin 131 whereby the electrode 12 is connected to the contact pin 131 in a non-detachable and form-fit manner.

Since the piezo load washers 1 are fabricated with diameters of several millimeters up to several centimeters, it is relatively difficult to perform the point welding on the opened housing 10. Today, due to the miniature format and the different variations in size of available piezo load washers 1, an automation of the fabrication of the electrical connection of electrode 12 to contact pin 131 of the connection device 13 is impossible.

During resistance welding, contaminations occur frequently that interfere with the electrical conductivity of the connection between electrode 12 and contact pin 131. In addition to an insufficient electrical contact between electrode 12 and contact pin 131, short circuits may occur during spot welding. If such poor electrical connections are not detected before the housing 10 is closed and sealed by welding in a pressure-tight manner, the piezo load washer 1 will be completely unusable. Generally, a close examination of the welding after the electrical connection is fed through and prior to closing the housing 10 must be carried out manually, leading to additional effort.

SUMMARY OF THE INVENTION

It is an object of the present invention to improve a piezoelectric force sensor so that an electrical connection between an electrode and a contact pin disposed in the housing of the piezoelectric force sensor can be achieved reproducibly and without causing conductivity problems and which additionally can be manufactured more easily than is known from the prior art.

The object is achieved as explained more fully below. In the force sensor according to the invention, a helical compression spring is electrically conductively connected to the contact pin forming an electrical connection inside the piezoelectric force sensor. The helical compression spring is operatively connected to the electrode in an electrically conductive and removable manner so that the contact pin has a spatial clearance with respect to the electrode. In this way, measurement signals from the electrode can be led out according to the invention from the housing of the piezoelectric force sensor via the helical compression spring and the connected contact pin and can be tapped on the connection device.

The advantage of this device is that using this connection, no force can be transferred from the contact pin onto the electrode even if the contact pin is strongly shaken. Furthermore, welding is no longer necessary since the connection between the electrode and the helical compression spring is now removable, i.e. not fixed. It has been found that this connection at all times ensures a very reliable contact although the electrode and the helical compression spring are only touching each other.

The term "removable" in connection with this invention only refers to the fact that the electrode and the helical compression spring are not attached to each other in a non-detachable manner, in particular are not welded to each other as it is known from the prior art. Because it is a connection inside the force sensor, this removable connection upon having been established is never unfastened again. Therefore, the removable connection should not be confused with a detachable connection being indeed detached, as it is usual in the case of plug connections that can be connected and detached as desired. The connection according to the invention inside the force sensor that is removable per se is not accessible and thus technically not detachable without destroying the force sensor. Nevertheless, the connection per se by itself is removable.

BRIEF DESCRIPTION OF THE DRAWINGS

A preferred embodiment of the object of the invention is described in the following in connection with the attached drawings. The same reference numerals in each case refer to the same components. The FIGS. 2 and 3 show embodiments according to the invention.

FIG. 1a shows a partially cut away side view of a piezoelectric force sensor formed as a piezo load washer according to the prior art, while

FIG. 2a shows a perspective view of an electrical connection comprising a contact pin with helical spring wherein a wedge-shaped electrode tab is attached, while FIG. 2c shows a perspective view of another variation of a removable electrical connection between an electrode tab and a helical spring wherein the electrode tab has an L shape and a shorter leg is inserted between the coils, while

DESCRIPTION OF EXEMPLARY EMBODIMENTS OF THE INVENTION

Figure 1A:
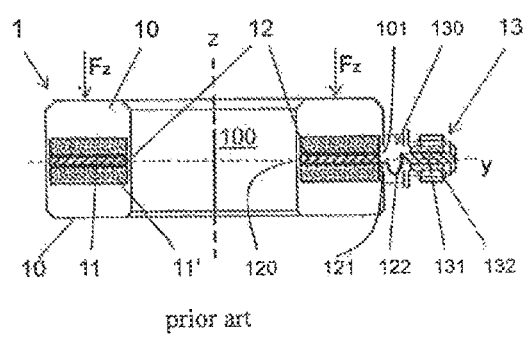

In the following, an electrical connection for leading electrical signals of a piezoelectric force sensor 1, in particular of a piezo load washer 1, will be explained referring to FIGS. 2 and 3. The simplest piezo load washers 1 can measure forces in one spatial direction (Fz in this case) between 0 and more than 1000 kN. For this purpose, the piezoelectric force sensors 1 have at least one piezoelectric body 11 arranged with an electrode 12 inside a housing welded in a pressure-tight manner. An electrical connection ensures that electrical signals can be extracted from outside the housing 10. From outside the housing 10, a connecting cable is connected to a connection device 13 so that measurement signals can be extracted to measurement electronics with a charge amplifier.

Here, the main focus lies on the electrical connection within the piezoelectric force sensor 1, and thus, for the purpose of clarity a representation of the at least one piezoelectric body 11 and the housing 10 which may be constructed as is known from the prior art has been omitted or is only indicated by dotted lines, respectively. The connection device 13 of the piezoelectric force sensor 1 together with the housing 10 forms a common interior cavity that surrounds the connection opening 101 and is tightly sealed. The connection device 13 is fastened, preferably welded, to the housing 10 in a non-detachable manner. No access from the outside is provided to this internal cavity, neither through the housing nor via the connection device 13, the feedthrough 130 of which is sealed.

Figure 1B:
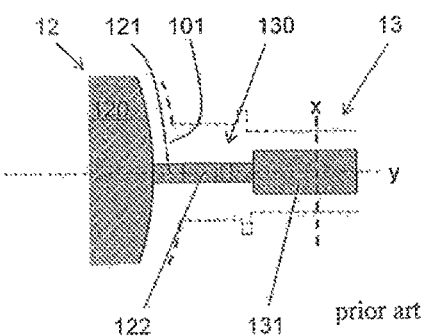
FIG. 1b shows a detailed sectional view through a portion of the electrode, a contact pin with electrode tab welded thereto, of the piezo load washer of FIG. 1a where a depiction of the piezoelectric body has been omitted.
Figure 1C:
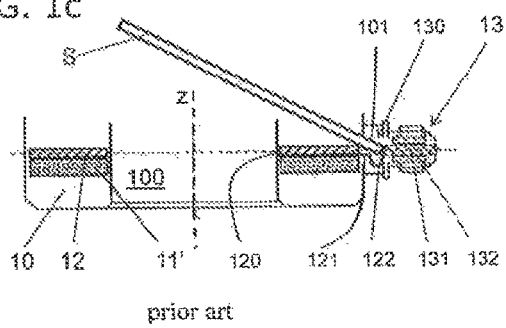
FIG. 1c shows in a partial sectional view the form-fit attachment of the joining plate and the electrode tab, respectively, on the contact pin prior to closing the housing.

In particular, the inner construction of the force sensor 1 may be as is represented and described in the FIG. 1 with the exception of the connection between electrode 12 and a contact pin 131. In each of FIGS. 2 and 3, an electrode 12 is shown having an electrode body 120 with or without an electrode tab 120 wherein the electrode 12 is positioned in a housing 10 as described in FIG. 1. The electrical connection is provided between the electrode 12 or the electrode tab 120, respectively, and a contact pin 131 and is designed as a removable connection.

Contact pin 131 forms part of a connection device 13 arranged abutting on the housing 10. The contact pin 131 is made electrically conductive, and in its portion facing away from the housing 10 the contact pin 131 is surrounded by an insulation 132. In this way, an insulated leadthrough of electrical charges from the electrode 12 through the contact pin 131 into the connection device 13 can be achieved. On the connection device 13 and, thus, outside the housing 10, suitable connecting cables with appropriate connectors or sockets can be easily removably connected, for example by means of a screw thread. On the other hand, a connecting cable may also be fastened in a fixed or non-detachable manner, respectively, to the connection device 13 for forwarding the measurement signals.

To achieve the electrical connection between the electrode 12 and the contact pin 131 and, thus, the conduction of electrical signals, in particular of measurement signals, from the electrode 12 out of the housing 10, a helical compression spring 14 is employed that is made of an electrically conductive material and is fastened to the contact pin 131 at a contact pin-facing end 141, preferably in a non-detachable and form-fit manner, preferably by means of welding. This form-fit connection is arranged in form of the spring attachment 140 at the contact pin-facing end 141 of the helical compression spring 14. The helical compression spring 14 has a spring length l and is contacted with the electrode 12 in various ways. For this purpose, an electrode-facing end 142 of the helical compression spring 14 is removably connected with the electrode 12 or the electrode tab 121, respectively. Electrode 12 and contact pin 131 are spaced apart with respect to each other, which spatial clearance is bridged by the helical compression spring 14. Touching the electrode 12 by the contact pin 131 is avoided.

Due to this spaced apart and indirect connection via the helical compression spring 14, the contact pin 131 is mechanically decoupled from the electrode since the helical compression spring 14 only abuts against the electrode 12 so that no force can be transferred from the contact pin 131 onto the electrode 12.

Depending on the selection of a helical compression spring 14, forces in all three spatial directions x, y, z can be received that are absorbed by the helical compression spring 14. The measurement accuracy of the piezoelectric force sensor 1 having an electrical connection of this type is enhanced, since almost no interferences due to the cable connection from the connection device 13 act onto the electrical connection.

The manufacture of such an electrical connection as part of the assembly of the piezoelectric force sensor 1 is straightforward and can be established considerably faster and particularly without contamination relative to the prior art. Due to the plugged connection between the helical compression spring 14 and the electrode 12 or the electrode tab 121, respectively, the surfaces of the spring wire and the electrode 12 or the electrode tab 121, respectively, will be unaffected or uncontaminated.

Figure 2A:
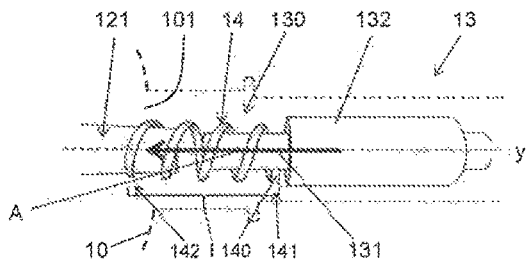

In a variation according to FIG. 2a, the electrode tab 121 is wedge-shaped. The electrode tab 121 must be at least partially wedge-shaped. The helical compression spring 14 is attached on the electrode tab 121 in the direction of its spring axis A, and the wedge-shaped portion is inserted into the coil diameter of the helical compression spring 14. In this case, two coils are represented attached onto the electrode tab 121. However, it is also possible to have more than two coils establish the conductive convection. It is important that the front face of contact pin 131 is spaced apart from electrode tab 121 so that a spring effect can be utilized. Due to the torsion of the helical compression spring 14 with the wedge-shaped part inserted, the spring wire closely follows the shape of the electrode tab 121 so that an electrically conductive connection is generated, which due to the torsional stress is sufficiently stable for performing measurements with a piezoelectric force sensor 1. Electrical signals can be transferred from electrode 12 via electrode tab 121 and helical compression spring 14 up to contact pin 131.

Figure 2B:
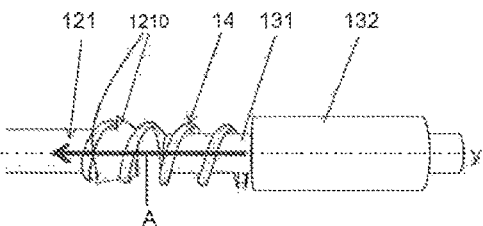
FIG. 2b shows a perspective view of an electrical connection having an electrode tab with barbed hooks.

In the variation according to FIG. 2b, to further prevent an undesired slipping out of the helical compression spring 14 from the electrode tab 121, electrode tab 121 is additionally provided with barbed hooks 1210. The embodiment having at least one barbed hook 1210 achieves an almost complete prevention of undesired separation of the connection between electrode tab 121 and helical compression spring 14. Also in this case, two coils are closely surround the inserted part of the electrode tab 121 whereby a removable electrical connection is achieved that is sufficient for use in a piezoelectric force sensor 1. Also here, the inserted part of the electrode tab 121 can be surrounded by more than two coils, although sufficient distance of the front face of contact pin 131 from electrode tab 121 must be ensured in each case for a spring effect to be achieved.

Figure 2C:
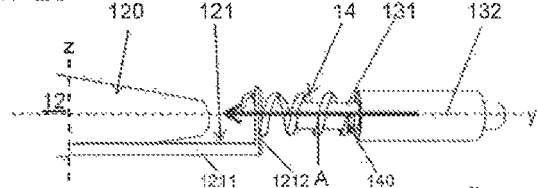

In the variation according to FIG. 2c, electrode tab 121 has an L shape. A first leg 1211 of the electrode tab 121 extends away from the electrode body 120, preferably radially away from the electrode circumferential surface. A second leg 1212 extends next to the first leg 1211 in an angle of about 90° in z direction. Here, the second leg 1212 is shorter than the first leg 1211 and is inserted between the coils of helical compression spring 14. The second leg 1212 contacts the spring wire between the coils of the helical compression spring 14 whereby an electrically conductive removable connection between electrode 12 and contact pin 131 is achieved via helical compression spring 14. Also in this case, helical compression spring 14 is connected to contact pin 131 at the spring attachment 140 in a form-fit manner so that the electrically conductive connection is established. To enable the insertion of the second leg 1212 between the cons, the spring axis A of helical compression spring 14 is arranged here in a height extending approximately centrally to the thickness direction of electrode 12. Here, the spring axis A extends on the same level as and along the y axis. In direction z, the first leg 1211 is positioned offset from the centre of the electrode 12 in z direction to a lateral surface of the electrode 12. Due to this L shape of electrode tab 121, the second leg 1212 can in this case be inserted from below to extend between the coils.

Figure 2D:
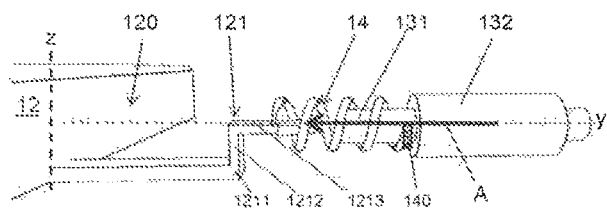
FIG. 2d shows a perspective view with a stepped electrode tab wherein a leg facing the helical compression spring is partially inserted in the coils.

In FIG. 2d a variation of an electrical connection is represented wherein the electrode tab 121 has a stepped design and the rest of the assembly corresponds to the assembly according to FIG. 2c. Also in this case, a first leg 1211 leads into a second leg 1212 angled in z direction followed by a transition into a third leg 1213 at the bending into the y direction. Here, the first leg 1211 and the third leg 1213 are arranged to run approximately parallel to each other. The third leg 1213 extending linearly in y direction partly in the direction of the spring axis A is inserted into the helical compression spring 14. Optionally, third leg 1213 may be wedge-shaped or may be provided with barbed hooks. However, this surface extends perpendicularly to the plane of the drawing so that this cannot be seen in FIG. 2d. In a view turned by 90° the leg 1213 of FIG. 2d might look similar to the end of the electrode flag 121 of FIG. 2b, for example.

This stepped design of the electrode tab 121 is required if the spring axis A of the helical compression spring 14 is to extend about centrally with respect to the thickness of the electrode body 120 while the electrode tab 121 is arranged in the proximity of a side surface of the electrode 12.

Figure 3A:
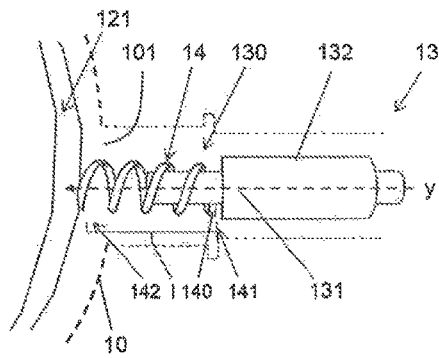
FIGS. 3a-3c show embodiments in perspective view without electrode tab wherein the helical spring a) makes a contact on the electrode circumferential surface, b) is inserted in a blind hole in the electrode circumferential surface, or c) is operably connected to the electrode with circumferential surface teeth.
Figure 3B:
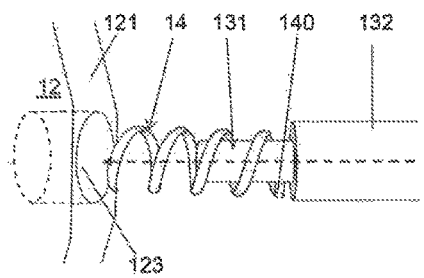
Figure 3C:
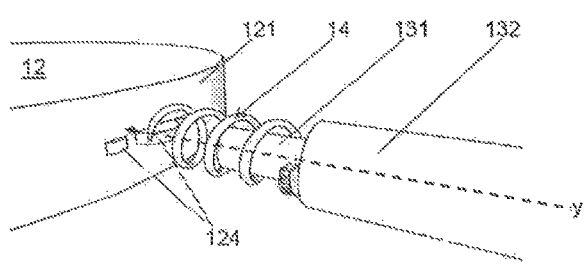

In FIGS. 3a to 3c are shown other variations of establishing the electrical connection between the electrode 12 and the contact pin 131. In this case, the contact between the respective helical compression spring 14 used to connect to the contact pin 131 in an electrically conductive and non-detachable manner and the electrode 12 has not yet been established, and accordingly electrode 12 and contact pin 131 are not yet connected in an electrically conductive and removable manner.

FIG. 3a shows how helical compression spring 14 may be pressed directly onto an electrode circumferential surface and may be removably attached under pressure in the spring axis direction. Helical compression spring 14 with the contact pin 131 attached thereto is pressed in the direction of the spring axis, in y direction in this case, onto electrode 12 and is later fixed in that position. If later during use a relative movement between the contact pin 131 and the electrode 12 should occur, such relative movement will be absorbed by the helical compression spring 14 for the most part so that almost no interfering forces will act onto the electrode 12 or the piezoelectric body. Accordingly, the measurement results that can be achieved will be improved. The electrode-facing end 142 of helical compression spring 14 extends into the housing 10 and directly contacts the electrode circumferential surface.

In a variation, a bore 123 can be arranged in the electrode body 120, here having the form of a blind hole 123, into which helical compression spring 14 can be partially inserted. This is shown in FIG. 3b. The electrode-facing end 142 of helical compression spring 14 is sunk into the bore 123 wherein the length l of helical compression spring 14 and in particular the resilient portion of helical compression spring 14 is selected so that the contact pin 131 does not directly come into contact with the electrode circumferential surface.

This also applies to the variation according to FIG. 3c in which circumferential surface teeth 124 are arranged on the electrode circumferential surface to which the helical compression spring 14 can be operably connected. Here, by attaching some coils of the helical compression spring 14, a removable electrical connection of the helical compression spring 14 with the molded or fastened circumferential surface teeth 124 is achieved upon movement of the spring axis in the y direction. The circumferential surface teeth 124 can have different shapes and can be inserted between the coils of the helical compression spring 14 to different depths.

If the connection device 13 and, thus, the contact pin 131 is acted upon from the outside with forces in one of the three spatial directions, helical compression spring 14 will largely absorb these forces so that no or only minimal forces will act onto electrode 12 and possibly onto piezoelectric body 11.

In the manufacture of a piezoelectric force sensor 1, the helical compression spring 14 is guided through the connection opening 101 from the exterior of the housing 10 and is operably connected to the electrode 12 in various ways so that a removable electrically conductive connection is established. Doing so, the helical compression spring 14 is connected to the electrode 12 in a preloaded manner. When the electrical connection between electrode 12 and helical compression spring 14 is established, the contact pin 131 remains spaced apart from the electrode 12. In this way, the spring effect of the helical compression spring 14 can be utilized.

The contact pin 131 and the insulation 132 can be fixedly arranged in the feedthrough 130. After the connection between the helical compression spring 14 and the electrode 12 has been established, the feedthrough 130 of the connection device 13 can be fastened, in particular welded, to the housing 10.

However, it is also possible that feedthrough 130 of the connection device 13 is already fixedly attached to the housing 10 before the helical compression spring 14, the contact pin 131 and the insulation 132 are fastened partially across the feedthrough 130.

In all variations, of the total amount of coils of the helical compression spring 14 at least one coil at the contact pin-facing end 141 of the helical compression spring 14 is placed over the contact pin 131 while several coils in the region of the electrode-facing end 142 are unattached and spaced apart from the contact pin 131. The coils not attached to the contact pin 131 can absorb forces.

As the material for the helical compression spring 14, only electrically conductive materials can be used. In addition to preferred known spring steels that should be stainless, nickel or alloys may be employed.

The helical compression spring 14 can be provided with a constant coil diameter and have a cylindrical basic shape. However, the helical compression spring 14 can also be designed as a conical spring or truncated cone-shaped helical compression spring with tapering coil diameter or with various regions of different coil diameters. The pitch of the coils of spring wire may be variously selected and may also vary along the length l of the helical compression spring 14.

The electrical connection that is described here using a simple piezoelectric force sensor for measuring forces in one spatial orientation as an example can also be used for piezoelectric force sensors with more than one piezoelectric body. Such piezoelectric force sensors 1 enable the measurement of forces in two and more spatial directions with a piezoelectric force sensor in which also more than one electrode can be used. In the latter case, each electrode 12 can be removably connected by means of the electrical connection set forth herein having a contact pin 131.

Another embodiment according to the invention comprises two or more electrodes 12, each of which is separately contacted in an identical manner via helical compression springs 14 with contact pins 131 so that two or more measurement signals can be picked up from the connection device 13 of the force sensor 1.

LIST OF REFERENCE NUMERALS

1 piezoelectric force sensor/piezo load washer
10 housing
100 central opening
101 connection opening
11 piezoelectric body (at least one)
12 electrode (at least one)
120 electrode body
121 electrode tab
1210 barbed hooks
1211 first leg
1212 second leg
1213 third leg
122 joining plate
123 bore/blind hole
124 circumferential surface teeth
13 connection device/z. B. plug connector or screw bushing
130 feedthrough
131 contact pin
132 insulation
14 helical compression spring
140 spring attachment
141 contact pin-facing end
142 electrode-facing end
l length of the helical compression spring
A spring axis
S welding electrode

The invention claimed is:
1. A piezoelectric force sensor, comprising:
a housing having at least one piezoelectric body and an electrode electrically connected to said body,
a connection device fastened or molded on the housing and having a contact pin for forwarding measurement signals, wherein said contact pin is connected to the electrode in an electrically conductive manner, a helical compression spring is electrically conductively connected to the contact pin and the helical compression spring is removably and electrically conductively connected to the electrode in an operative manner such that the contact pin has a spatial clearance from the electrode and measurement signals from the electrode can be extracted from the housing of the piezoelectric force sensor via the helical compression spring and the connected contact pin and can be picked up at the connection device; and wherein the helical compression spring abuts against the electrode in a mechanically decoupled manner so that no force from the contact pin can be transmitted onto the electrode.

2. The piezoelectric force sensor according to claim 1, wherein the electrode has an electrically conductive electrode tab which is attached between the coils of the helical compression spring inserted in a movable contacting manner.

3. The piezoelectric force sensor according to claim 2, wherein the electrode tab is at least partially wedge-shaped.

4. The piezoelectric force sensor according to claim 2, wherein the electrode tab has at least one barbed hook.

5. The piezoelectric force sensor according to claim 2, wherein the electrode tab is L shaped having a first leg and a second leg, wherein the first leg and the second leg are arranged with respect to each other angled in a z direction and the second leg is inserted extending between the coils of the helical compression spring.

6. The piezoelectric force sensor according to claim 5, wherein the angle between the first leg and the second leg is 90°.

7. The piezoelectric force sensor according to claim 2, wherein the electrode tab has a stepped shape having a first leg, a second leg and a third leg, wherein the first leg and the third leg are positioned extending parallel to each other.

8. The piezoelectric force sensor according to claim 1, wherein the helical compression spring is attached directly pressed onto an electrode circumferential surface in a preloaded manner.

9. The piezoelectric force sensor according to claim 1, wherein the electrode has a bore across an electrode circumferential surface into which the helical compression spring is inserted.

10. The piezoelectric force sensor according to claim 1, wherein the electrode has circumferential surface teeth on an electrode circumferential surface to which the helical compression spring is operatively connected.

11. The piezoelectric force sensor according to claim 1, wherein the helical compression spring is attached to the contact pin by means of a spring attachment in a non-detachable and form-fit manner.

12. The piezoelectric force sensor according to claim 1, wherein the connection device is designed for removable attachment of a connecting cable thereto by means of a thread, for forwarding the measurement signals.

13. The piezoelectric force sensor according to claim 1, wherein to the connection device a connecting cable for forwarding the measurement signals is non-detachably attached.

* * * * *